US012189547B2

(12) United States Patent
Han

(10) Patent No.: US 12,189,547 B2
(45) Date of Patent: Jan. 7, 2025

(54) MONOLITHIC SERIAL NOR FLASH WITH WIDE INPUT-OUTPUT BUS

(71) Applicant: Integrated Silicon Solution, (Cayman) Inc., Grand Cayman (KY)

(72) Inventor: SungJin Han, San Jose, CA (US)

(73) Assignee: Integrated Silicon Solution, (Cayman) Inc., Grand Cayman (KY)

( * ) Notice: Subject to any disclaimer, the term of this patent is extended or adjusted under 35 U.S.C. 154(b) by 49 days.

(21) Appl. No.: 17/937,396

(22) Filed: Sep. 30, 2022

(65) Prior Publication Data

US 2023/0350821 A1 Nov. 2, 2023

Related U.S. Application Data

(60) Provisional application No. 63/364,030, filed on May 2, 2022.

(51) Int. Cl.
G06F 13/16 (2006.01)
(52) U.S. Cl.
CPC ...... G06F 13/1673 (2013.01); G06F 13/1689 (2013.01)
(58) Field of Classification Search
CPC .................................................. H10N 70/20
See application file for complete search history.

(56) References Cited

U.S. PATENT DOCUMENTS

| 9,183,917 B1* | 11/2015 | Cho ................. G06F 12/1018 |
| 2008/0151622 A1 | 6/2008 | Qawami et al. |
| 2011/0072201 A1 | 3/2011 | Lee et al. |
| 2018/0166130 A1* | 6/2018 | Intrater ............. G11C 16/3459 |

FOREIGN PATENT DOCUMENTS

| EP | 3968332 A1 | 3/2022 |
| WO | 2011034611 A1 | 3/2011 |

OTHER PUBLICATIONS

EP Search Report and European Search Opinion from Application No. 23275050.5, dated Sep. 13, 2023, 8 pages.

* cited by examiner

Primary Examiner — Henry Tsai
Assistant Examiner — Juanito C Borromeo

(57) ABSTRACT

A monolithic serial NOR Flash memory device includes a single semiconductor memory die with a wide input-output (IO) bus. More specifically, the monolithic serial NOR Flash memory device is configured with an input-output (IO) bus including N number of IO terminals, also referred herein as IO pins. The memory device of the present disclosure transfers commands through a subset of the N IO terminals while transferring data through all of the N IO terminals. In one example, the subset of IO terminals is N/2 IO terminals. In one example, the serial NOR Flash memory device is implemented as a serial octal (base 8) NOR flash memory device. As thus configured, the serial octal NOR flash memory device of the present disclosure transfers command though 8 IO pins, transfers address through 8 IO pins or 16 IO pins, and transfers data though 16 IO pins.

18 Claims, 5 Drawing Sheets

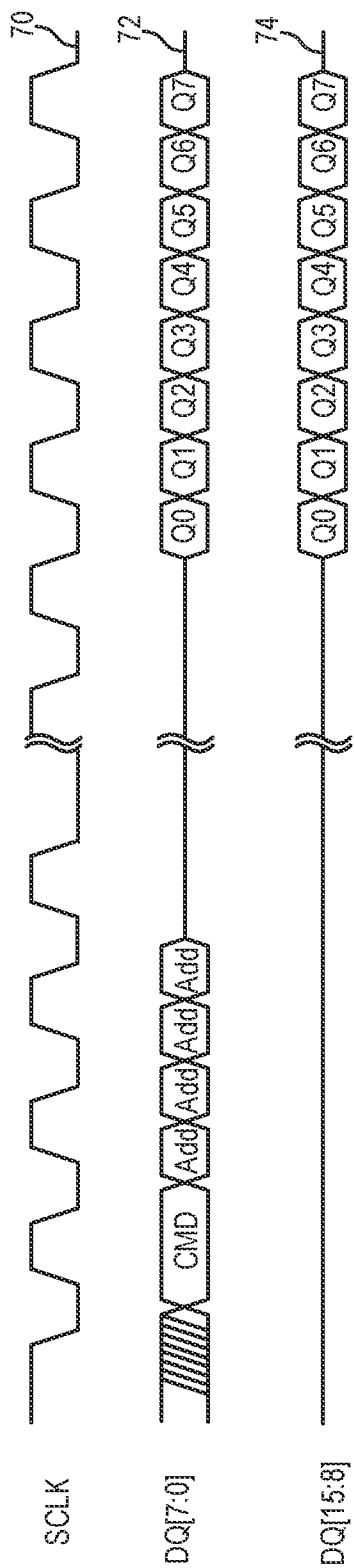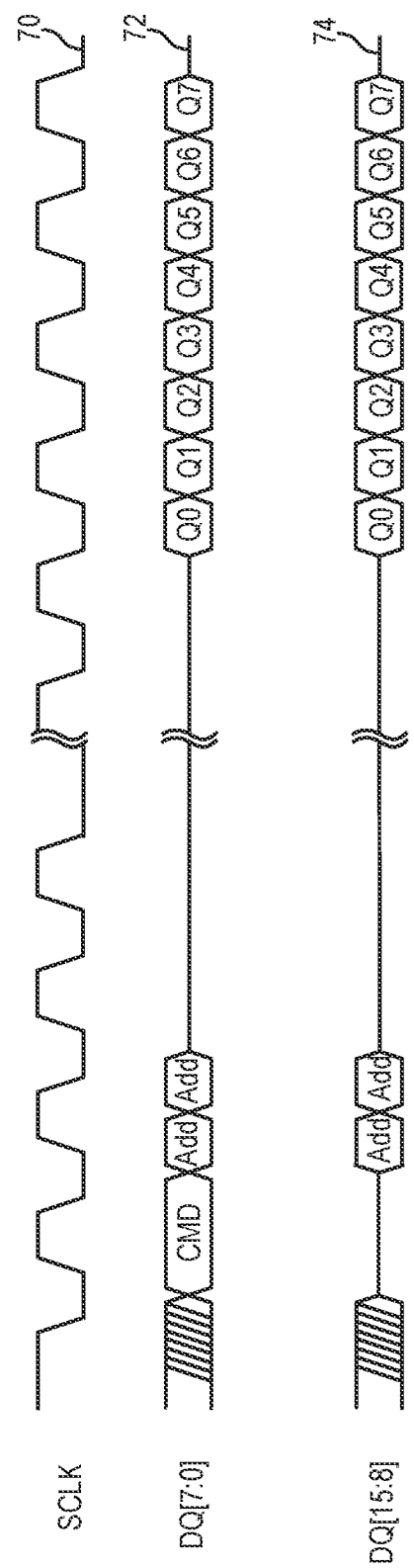

MONOLITHIC SERIAL NOR FLASH WITH WIDE INPUT-OUTPUT BUS

CROSS REFERENCE TO RELATED APPLICATIONS

This application claims priority to U.S. Provisional Patent Application No. 63/364,030, entitled MONOLITHIC SERIAL NOR FLASH WITH WIDE INPUT-OUTPUT BUS, filed May 2, 2022, which is incorporated herein by reference for all purposes.

FIELD OF THE INVENTION

The invention relates to memory devices and, in particular, to a serial NOR Flash memory device with wide input-output bus for increased data bandwidth.

BACKGROUND OF THE INVENTION

Serial NOR memory devices, typically NOR flash memory devices, interfaces a host device via a serial interface bus. Serial NOR memory devices are becoming popular in booting memory application where there is more frequent read operation than write operation. In one example, a serial octal NOR flash memory device is configured to transfer command, address and data through eight input-output (IO) pins. Conventional methods to increase the performance of the serial NOR flash memory devices include increasing the operating frequency to increase data output bandwidth. However, increasing operating frequency often has some limitations in technology.

Another method to improve the performance of the serial NOR flash memory devices includes packaging two or more NOR flash memory dies into a single package, as shown in FIG. 1. FIG. 1 illustrates a multi-die NOR flash memory device in some examples. Referring to FIG. 1, the multi-die (or multi-chip) NOR flash memory device 10 is formed using two identical serial octal NOR flash memory dies 12a, 12b that are packaged together in a multi-chip package (MCP). To external host systems, the multi-die flash memory device 10 is a single unit but internally, the two octal NOR flash memory dies 12a, 12b operate as two independent memory devices. The multi-die NOR flash memory device transfers command, address and data through the combined IO pins of the two memory dies; thus the multi-die flash memory device transfer command/address/data through 16 IO pins, denoted as DQ [7:0] and DQ [15:8] in FIG. 1. FIG. 2 illustrates the operating signal waveforms for the multi-die NOR flash memory device of FIG. 1 in some examples. When operated under the double data rate scheme, commands (CMD) are provided on the 16 IO pins (DQ [15:8] and DQ [7:0]) over two clock edges of the serial clock SCLK to each internal memory die 12a or 12b. Addresses (Add) are also provided on the 16 IO pins at each clock edge to each internal memory die. Finally, each memory die provides read data or receive write data (Q0 to Q7) on the 16 IO pins at each clock edge of the serial clock SCLK.

The dual die approach or multi-die approach increases the data bandwidth of the memory device but comes at the cost of increased power consumption. The package assembly cost of two or more memory dies in a single semiconductor package is also increased. Furthermore, each individual serial octal NOR flash memory die must be controlled independently, increasing the complexity for the host controller design. For example, the host may need to provide separate memory controllers for each memory die in the multi-chip memory device.

SUMMARY OF THE INVENTION

The present disclosure discloses a serial NOR memory device, substantially as shown in and/or described below, for example in connection with at least one of the figures, as set forth more completely in the claims.

In one embodiment, a serial NOR memory device includes a memory cell array including one or more memory cells for storing data and an input-output circuit including a transceiver coupled to receive a clock signal on a clock input terminal and to receive or transmit signals on an input-output bus including N number of input-output terminals. The transceiver is configured to receive command signals on a subset of the N input-output terminals and to receive write data signals or transmit read data signals on the N input-output terminals. The command signals are provided to perform a memory operation to one or more memory cells in the memory cell array.

In another embodiment, a method in a serial NOR memory device including a memory cell array includes receiving a clock signal; receiving a command signal on M number of input-output terminals; receiving an address signal on P number of input-output terminals; in response to the command signal, performing a memory operation on one or more memory cells in the memory cell array designated by the address signal; and transferring data on N number of input-output terminals, wherein N is an integer larger than M.

These and other advantages, aspects and novel features of the present invention, as well as details of an illustrated embodiment thereof, will be more fully understood from the following description and drawings.

BRIEF DESCRIPTION OF THE DRAWINGS

Various embodiments of the invention are disclosed in the following detailed description and the accompanying drawings. Although the drawings depict various examples of the invention, the invention is not limited by the depicted examples. It is to be understood that, in the drawings, like reference numerals designate like structural elements. Also, it is understood that the depictions in the figures are not necessarily to scale.

FIG. 5 is a timing diagram illustrating the operation of the wide IO serial NOR flash memory device in embodiments of the present invention.

FIG. 6 is a timing diagram illustrating the operation of the wide IO serial NOR flash memory device in alternate embodiments of the present invention.

DETAILED DESCRIPTION OF THE INVENTION

In embodiments of the present disclosure, a monolithic serial NOR Flash memory device includes a single semiconductor memory die with a wide input-output (IO) bus. More specifically, the monolithic serial NOR Flash memory device ("memory device") is configured with an input-output (IO) bus including N number of IO terminals, also referred herein as IO pins. The memory device of the present disclosure transfers commands through a subset of the N IO terminals while transferring data through all of the N IO terminals. In one example, the subset of IO terminals is N/2 IO terminals. In one example, the serial NOR Flash memory device is implemented as a serial octal (base 8) NOR flash memory device. As thus configured, the serial octal NOR flash memory device of the present disclosure transfers command though 8 IO pins, transfers address through 8 IO pins or 16 IO pins, and transfers data though 16 IO pins. The serial NOR Flash memory device of the present invention improves the data bandwidth by transferring data over at least double the number of IO pins as compared to a conventional serial NOR flash memory device. Meanwhile, by using a monolithic semiconductor memory die, the power consumption is reduced and the complexity of the host controller design is simplified as compared to conventional multi-die memory device configurations.

Figure 1:
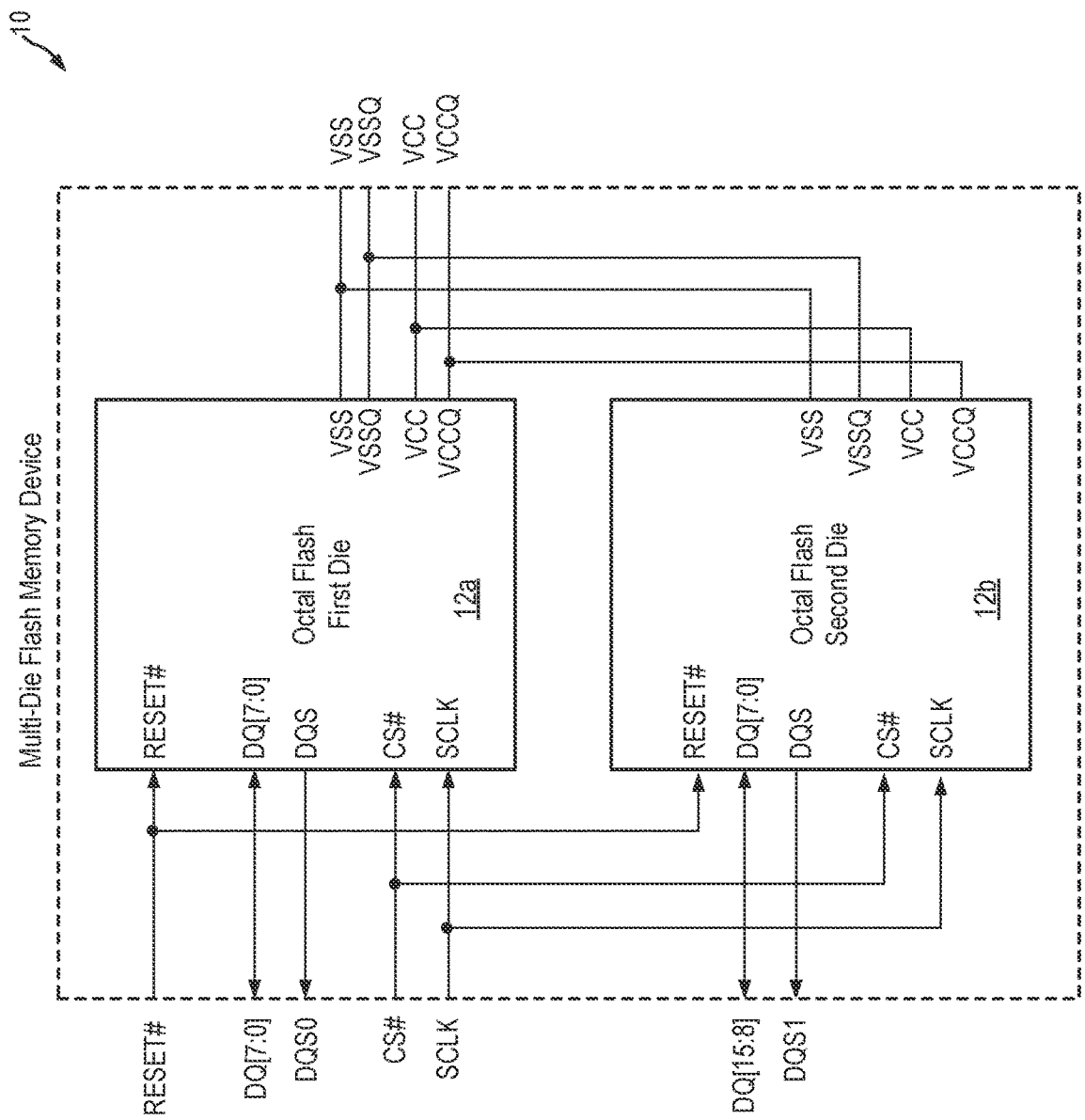
FIG. 1 illustrates a multi-die flash memory device in some examples.
Figure 2:
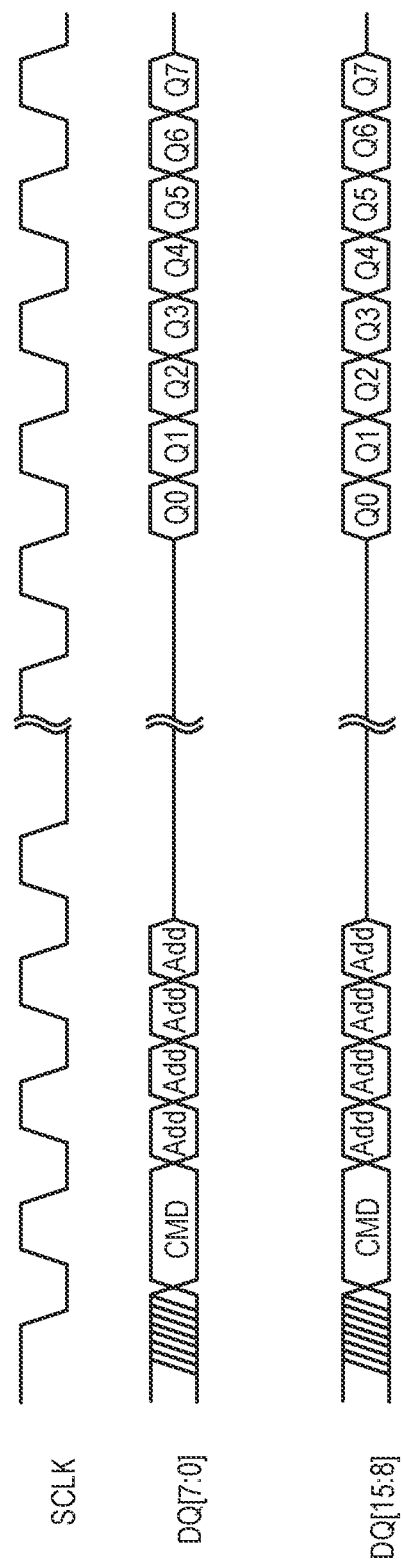
FIG. 2 illustrates the operating signal waveforms for the multi-die flash memory device of FIG. 1 in some examples.
Figure 3:
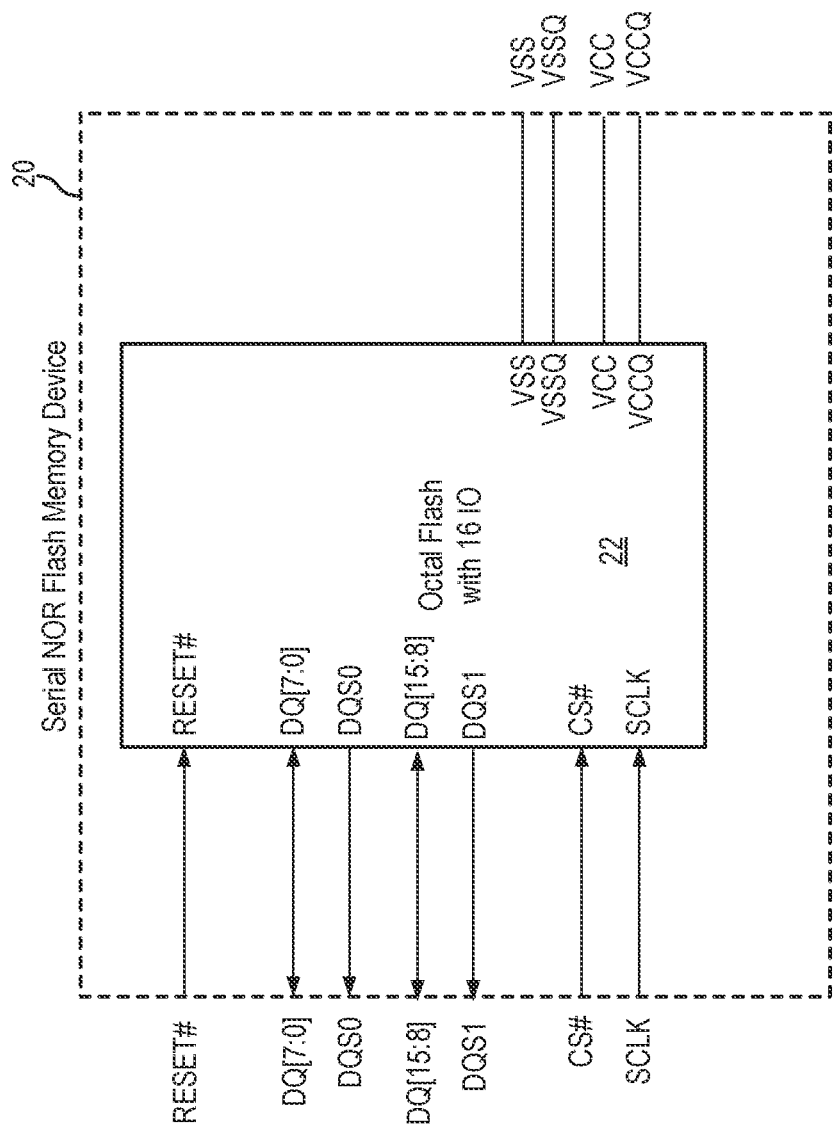
FIG. 3 is a schematic diagram of a monolithic serial NOR flash memory device in embodiments of the present invention.

FIG. 3 is a schematic diagram of a monolithic serial NOR flash memory device in embodiments of the present invention. Referring to FIG. 3, in the present embodiment, a monolithic serial NOR flash memory device 20 ("memory device 20") includes a monolithic semiconductor memory die 22 configured with a wide input-output bus including N number of IO terminals, N being a positive integer. That is, the memory device 20 includes DQ[(N−1):0] as the N number of IO terminals. In embodiments of the present disclosure, the memory device 20 is a serial octal NOR flash memory device and N is a multiple of 8. In the present example, N is 16. The memory device 20 has 16 IO terminals, denoted as DQ[7:0] and DQ[15:8]. As thus configured, the serial NOR flash memory device 20 of the present invention implements protocols to transfer commands over a subset of the N IO pins DQ[(N−1):0]. In particular, the serial NOR flash memory device transfers commands over N/2 IO pins, or 8 IO pins in the present example. Meanwhile, the serial NOR flash memory device 20 implements protocols to transfer data over the N IO pins, or 16 IO pins in the present example. Accordingly, the data bandwidth is doubled by using the 16 IO pins, as compared to only 8 IO pins in the conventional memory devices. The addresses can be transferred over N/2 or over N IO pins, depending on the user configuration.

The serial NOR flash memory device of the present invention realizes many advantages over conventional memory devices. First, the serial NOR flash memory device of the present invention reduces power consumption by using a monolithic design as compared to the multi-die approach. Second, when commands are transferred through only 8 of the 16 IO pins, the serial NOR flash memory device of the present invention can be used to upgrade existing memory device sockets that are using conventional serial NOR flash devices. Third, serial NOR flash memory device of the present invention includes a single memory die which greatly simplifies the memory controller design, as compared to the multi-die approach. Fourth, the serial NOR flash memory device of the present invention realizes manufacturing cost saving in both assembly cost and in die cost, as compared to the multi-die approach. Fifth, the input capacitance for the clock pin and the chip select (CS) pin is reduced with the use of a monolithic memory die. Lastly, the serial NOR flash memory device of the present invention can use just one data strobe pin at lower frequency because the memory device includes only a single die. In the multi-die memory device, each memory die must receive its own data strobe pin, increasing the complexity of control and increasing the total pin count of the memory device.

In the present description, a serial NOR memory device refers to a NOR memory device that uses a serial interface to communicate with a host device using a given serial protocol. The serial NOR memory device is typically a NOR flash memory device. In some examples, the serial NOR memory device is a SPI NOR flash memory device. A SPI NOR flash memory device is a NOR flash memory that interfaces a host device via a serial peripheral interface (SPI) bus and follows SPI protocol. In other embodiments, other types of serial interface protocol may be used.

Figure 4:
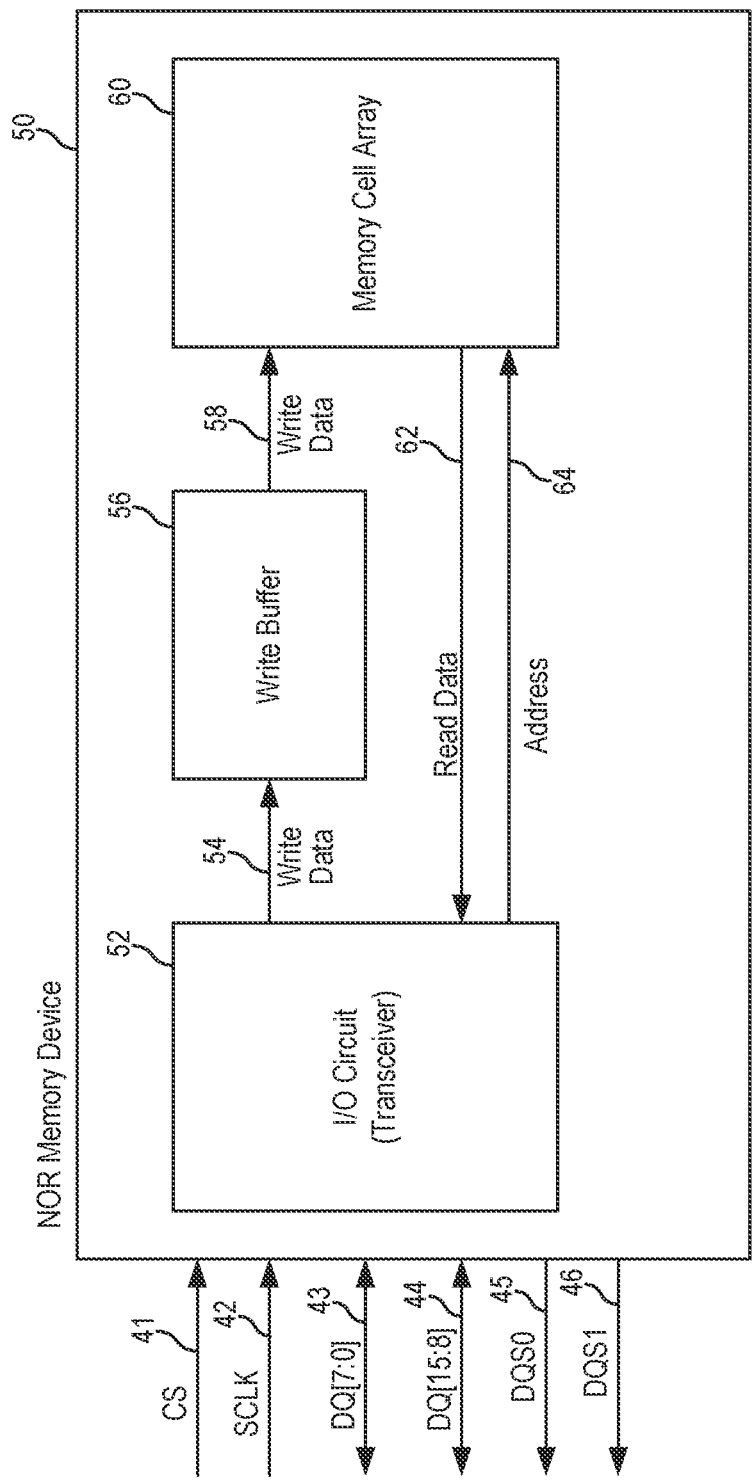
FIG. 4 illustrates a serial NOR memory device in embodiments of the present disclosure.

FIG. 4 illustrates a serial NOR memory device in embodiments of the present disclosure. Referring to FIG. 4, a serial NOR memory device 50 uses a serial data interface to communicate with a host device (not shown). In the present embodiment, the serial NOR memory device 50 receives a chip select signal (CS) on a first terminal 41 and a serial clock signal (SCLK) on a second terminal 42. The serial NOR memory device 50 includes 16 input-output (IO) terminals (or IO pins) DQ[7:0] (data bus 43) and DQ[15:8] (data bus 44) for transferring commands, addresses, read and write data. In particular, the serial NOR memory device 50 receives commands, addresses and write data from the host device on the IO terminals and provides read data output on the IO terminals. In the present embodiment, the serial NOR memory device 50 includes two data strobe pins DQS0 (terminal 45) and DQS1 (terminal 46). Each data strobe pin is configured to control a set of 8 IO terminals. For example, the data strobe pin DQS0 is associated with IO terminals DQ [7:0] and data strobe pin DQS1 is associated with IO terminals DQ [15:8].

The serial NOR memory device 50 includes an input-output circuit 52 which functions as the interface to receive input data to the memory device and to provide output data from the memory device. In some embodiments, the input-output circuit 52 includes a transceiver circuit and input-output buffers. The transceiver circuit includes a receiver circuit to receive incoming data and a transmitter circuit to transmit outgoing data. Under a given serial protocol, the serial NOR memory device 50 receives the chip select signal CS to indicate the particular device is selected for access. The serial NOR memory device 50 further receives the serial clock signal SCLK to indicate the clock rate for the input and output signals. Finally, the serial NOR memory device 50 receives serial input data on the IO terminals DQ [7:0] and DQ [15:8], which includes commands, addresses and write data. The commands can include a read command for reading data from the memory device and a write command for writing or programming data to the memory device. The serial NOR memory device 50 outputs serial output data on the IO terminals DQ [7:0] and DQ [15:8]. More specifically, the serial output data is the read data retrieved from the memory array. The serial NOR memory device 50 includes a memory cell array 60, typically including an array of storage transistors or memory cells, for storing data. In operation, the serial NOR memory device 50 receives commands with an associated address where the address designates one or more memory cells for access by the commands to perform memory operations. For example, in response to a write command, input write data is stored into the memory cell in the memory cell array 60 designated by the address; and in response to a read command, read data is retrieved from the memory cell in the memory cell array 60 designated by the address and provided as output data.

In embodiments of the present disclosure, the serial NOR memory device 50 is a NOR flash memory device and the memory cell array 60 is an array of flash memory cells. In a flash memory device, write data is written into the flash memory cells through a program operation. The serial NOR memory device 50 may include a write buffer 56 for storing incoming write data, provided on data bus 54, before the write data is provided to the memory cell array, on data bus 58, and programmed into the memory cell array 60. For example, the write buffer 56 may store one page of write data. For a read operation, read data from the memory cell array 60 is provided on a data bus 62 to the input-output circuit 52. No intervening buffer is used. For both the read and write operation, the input-output circuit 52 provides the respective memory address to the memory cell array 60 on an address bus 64.

In the present embodiment, the input-output circuit 52, the write buffer 56 and the memory cell array 60 are formed on a semiconductor substrate as a monolithic semiconductor memory die, sometimes referred to as a "flash memory die."

It is instructive to note that the construction of the serial NOR memory device 50 in FIG. 4 is simplified to illustrates only elements relevant to the present disclosure. One of ordinary skill in the art would appreciate that in actual practice, the serial NOR memory device 50 includes elements not shown or not explicitly described herein to support the operation of the serial NOR memory device. The serial NOR memory device 50 in FIG. 4 is illustrative only and not intended to be limiting.

A salient feature of the serial NOR memory device 50 of FIG. 4 is that data signals are transmitted using double or more IO pins than the command signals. In this manner, data bandwidth is increased without changing the command signal protocols. In particular, the table below compares the input-output bus configurations for the conventional serial octal NOR memory devices, the dual-die serial octal NOR memory devices and the monolithic serial octal NOR memory device of the present invention.

TABLE 1

|  | Command Input | Address Input | Data Input/Output |
|---|---|---|---|
| Conventional Serial Octal NOR Flash | 8 pins | 8 pins | 8 pins |
| Dual-die Serial Octal NOR Flash | 16 pins | 16 pins | 16 pins |
| Monolithic Serial Octal NOR with wide IO bus | 8 pins | 8 or 16 pins | 16 pins |

As illustrated in Table 1, the conventional serial octal NOR flash memory device transfers command, address and data all over the 8-pin IO bus. When dual-die configuration is used, the dual-die serial octal NOR flash memory devices transfers command, address and data all over the 16-pin IO bus, but at the cost of increased power consumption, increased controller complexity and increased cost. The monolithic serial octal NOR flash memory device of the present invention transfers commands on 8 IO pins so as to employ the same controller protocol as the conventional serial octal NOR flash. Meanwhile, the data input-output is provided over a wide or expanded IO bus to increase the bandwidth. For example, when 16 pins are used for the data input-output, the monolithic serial octal NOR flash memory device of the present invention can double the data bandwidth without increasing the power consumption or controller complexity or cost.

FIG. 5 is a timing diagram illustrating the operation of the wide IO serial NOR flash memory device in embodiments of the present invention. In the embodiment shown in FIG. 5, when the memory device 50 of FIG. 4 is operated under the double data rate scheme, commands are provided on the 8 IO pins DQ [7:0] (curve 72) over two clock edges of the serial clock signal SCLK (curve 70) to the flash memory die. Addresses are also provided on the 8 IO pins DQ [7:0] (curve 72) at each clock edge of the serial clock SCLK to the flash memory die. Finally, the flash memory die provides read data or receive write data on the 16 IO pins DQ [15:8] (curve 74) and DQ [7:0] (curve 72) at each clock edge of the serial clock SCLK.

FIG. 6 is a timing diagram illustrating the operation of the wide IO serial NOR flash memory device in alternate embodiments of the present invention. In the embodiment shown in FIG. 6, when the memory device 50 is operated under the double data rate scheme, commands are provided on the 8 IO pins DQ [7:0] (curve 72) over two clock edges of the serial clock signal SCLK (curve 70) to the flash memory die. In this embodiment, addresses are provided on the 16 IO pins DQ [15:8] (curve 74) and DQ [7:0] (curve 72) at each clock edge to the flash memory die. Finally, the flash memory die provides read data or receive write data on the 16 IO pins DQ [15:8] (curve 74) and DQ [7:0] (curve 72) at each clock edge.

In some embodiments, the serial NOR flash memory device of the present invention further transfers register data through either a subset of the IO pins or through all of the IO pins. In one example, in an octal NOR flash memory device, the NOR flash memory device may transfer register data using 8 IO pins or using 16 IO pins.

In this detailed description, process steps described for one embodiment may be used in a different embodiment, even if the process steps are not expressly described in the different embodiment. When reference is made herein to a method including two or more defined steps, the defined steps can be carried out in any order or simultaneously, except where the context dictates or specific instruction otherwise are provided herein. Further, unless the context dictates or express instructions otherwise are provided, the method can also include one or more other steps carried out before any of the defined steps, between two of the defined steps, or after all the defined steps In this detailed description, various embodiments or examples of the present invention may be implemented in numerous ways, including as a process; an apparatus; a system; and a composition of matter. A detailed description of one or more embodiments of the invention is provided above along with accompanying figures that illustrate the principles of the invention. The invention is described in connection with such embodiments, but the invention is not limited to any embodiment. Numerous modifications and variations within the scope of the present invention are possible. The scope of the invention is limited only by the claims and the invention encompasses numerous alternatives, modifications, and equivalents. Numerous specific details are set forth in the description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured. The present invention is defined by the appended claims.

The invention claimed is:

1. A serial octal NOR memory device, comprising:
a memory cell array including one or more memory cells for storing data; and
an input-output circuit comprising a transceiver coupled to receive a clock signal on a clock input terminal and to receive or transmit signals on an input-output bus including N number of input-output terminals, N being a multiple of 8,
wherein the transceiver is configured to receive command signals on M input-output terminals and to receive write data signals or transmit read data signals on the N input-output terminals, the command signals being provided to perform a memory operation to one or more memory cells in the memory cell array, M being N/2.

2. The serial octal NOR memory device of claim 1, wherein the transceiver is further configured to receive address signals on P input-output terminals, the address signals being provided to designate one or more memory cells in the memory cell array for performing the memory operation, P being equal to M.

3. The serial octal NOR memory device of claim 1, wherein the transceiver is further configured to receive address signals on P input-output terminals, the address signals being provided to designate one or more memory cells in the memory cell array for performing the memory operation, P being equal to N.

4. The serial octal NOR memory device of claim 1, wherein the input-output bus has 16 input-output terminals as the N input-output terminals and the M input-output terminals includes 8 input-output terminals.

5. The serial octal NOR memory device of claim 1, wherein the memory device comprises a monolithic semiconductor memory die.

6. The serial octal NOR memory device of claim 5, wherein the memory cell array and the input-output circuit are formed on a semiconductor substrate of the monolithic semiconductor memory die.

7. The serial octal NOR memory device of claim 5, wherein the semiconductor memory die comprises a flash memory die.

8. The serial octal NOR memory device of claim 1, wherein the transceiver is configured to receive serial input data as the write data or transmit serial output data as read data on the N input-output terminals.

9. The serial octal NOR memory device of claim 8, further comprising:
a write buffer coupled to receive and store write data from the input-output circuit, the input-output circuit receiving the write data as part of the serial input data; and
the memory cell array including the one or more memory cells being configured to receive the write data from the write buffer and to store the write data into the one or more memory cells in the array; and the memory cell array further being configured to provide read data to the input-output circuit as the serial output data.

10. The serial octal NOR memory device of claim 9, wherein the input-output circuit, the write buffer and the memory cell array are formed on a semiconductor substrate.

11. A method in a serial octal NOR memory device comprising a memory cell array of memory cells, comprising:
receiving a clock signal;
receiving a command signal on M number of input-output terminals;
receiving an address signal on P number of input-output terminals;
in response to the command signal, performing a memory operation on one or more memory cells in the memory cell array designated by the address signal; and
transferring data on N number of input-output terminals, wherein N is an integer being a multiple of 8 and M is N/2.

12. The method of claim 11, further comprising:
in response to the command signal being a read command, retrieving read data from memory cells in the memory cell array designated by the address signal; and
transmitting the read data on the N number of input-output terminals.

13. The method of claim 11, further comprising:
receiving a write data on the N number of input-output terminals;
in response to the command signal being a write command, storing the write data in a write buffer; and
writing the write data from the write buffer into memory cells in the memory cell array designated by the address signal.

14. The method of claim 11, wherein P number of input-output terminals is equal to M number of input-output terminals.

15. The method of claim 11, wherein P number of input-output terminals is equal to N number of input-output terminals.

16. The method of claim 11, wherein the serial octal NOR memory device comprises a serial octal NOR flash memory device formed on a monolithic memory die and the memory cell array comprises flash memory cells.

17. The method of claim 11, wherein N number of input-output terminals is 16 and M number of input-output terminals is 8.

18. The serial octal NOR memory device of claim 1, wherein N number of input-output terminals is 16 or greater and the memory device further comprises:
a plurality of data strobe pins, each data strobe pin being configured to control a set of 8 input-output terminals within the N number of input-output terminals.

* * * * *